(12) United States Patent
Fukuda et al.

(10) Patent No.: US 7,471,087 B2
(45) Date of Patent: Dec. 30, 2008

(54) COMPENSATED NMR PROBE WITH HIGH Q VALUE FOR NMR APPARATUS

(75) Inventors: Yuzo Fukuda, Hitachi (JP); Kazuo Saitoh, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 47 days.

(21) Appl. No.: 11/588,368

(22) Filed: Oct. 27, 2006

(65) Prior Publication Data

US 2007/0096741 A1    May 3, 2007

(30) Foreign Application Priority Data

Oct. 28, 2005  (JP)  ............................. 2005-314902

(51) Int. Cl.
*G01V 3/00* (2006.01)

(52) U.S. Cl. ....................................... 324/322; 324/318

(58) Field of Classification Search ......... 324/300–322; 600/410–435; 333/219–235; 343/720, 725–730, 343/741–752, 893, 904–908
See application file for complete search history.

(56) References Cited

U.S. PATENT DOCUMENTS

| 4,906,934 | A | * | 3/1990 | Haragashira | ................. | 324/319 |
| 5,021,739 | A | * | 6/1991 | Yokosawa et al. | ........... | 324/248 |
| 5,578,920 | A | * | 11/1996 | Kuster et al. | ................. | 324/301 |
| 6,121,776 | A |   | 9/2000 | Marek |   |   |
| 7,235,975 | B2 | * | 6/2007 | Kasten et al. | ................ | 324/319 |

\* cited by examiner

*Primary Examiner*—Dixomara Vargas
(74) *Attorney, Agent, or Firm*—Antonelli, Terry, Stout & Kraus, LLP.

(57) ABSTRACT

A NMR probe which causes only a minimum disturbance to magnetic-field uniformity, and which acquires a high resonant Q value. A detection coil 1 for detecting a nuclear magnetic resonance signal emitted from a sample 3 measured, and a compensation coil 4 composed of a superconducting material for compensating for inductance of the detection coil 1 are electrically connected in series with each other. Moreover, a tuning-dedicated variable capacitor 6 is connected to the detection coil 1 in series therewith, and a matching-dedicated variable capacitor 5 is connected to the compensation coil 4 in series therewith. Furthermore, a coaxial cable 9 is connected to both ends of the matching-dedicated variable capacitor 5. This configuration allows detection of the signal.

10 Claims, 4 Drawing Sheets

COMPENSATED NMR PROBE WITH HIGH Q VALUE FOR NMR APPARATUS

BACKGROUND OF THE INVENTION

The present invention relates to the circuit configuration of a probe for a NMR (nuclear magnetic resonance) apparatus.

Nuclear magnetic resonance (NMR) spectroscopy is expected as one of effective tools for performing the structural analysis of macromolecular organic substances such as proteins in leading-edge life science and pharmaceutical production fields.

Since NMR is not so high in the measurement sensitivity, its high-sensitivity implementation can be pointed out as one of the problems concerned with NMR. Also, in order to analyze the structure of a more complicated molecule, it is becoming more and more required to enhance resolution of the resultant spectrum. In the history of NMR, the sensitivity and the resolution have been enhanced mainly by enhancing intensity of the static magnetic field.

As the other methods of enhancing the sensitivity, there exist methods of enhancing the probe performance. As one of them, there has been known a method of enhancing Q value of a probe coil. This Q value, which means the Q value in an electrical resonance, is given by $Q=\omega_C L/r$ in a simple parallel resonance circuit. Here, the simple parallel resonance circuit includes a coil having inductance L and series resistance r, and a capacitor having capacitance C.

Adjustment of the resonant frequency $\omega_C$ is performed using a variable capacitor. In the measurement of radio-frequency waves of a few tens of MHz or more, impedance matching is absolutely necessary for observing the signal effectively. The impedance matching is performed by a tuning circuit simultaneously with adjustment of the tuning. Here, the tuning circuit includes two or more capacitors as are illustrated in FIG. 6.

As another method of enhancing the probe performance, there exists a method disclosed in U.S. Pat. No. 6,121,776. By cooling the probe coil manufactured with a superconducting material, this method allows low-temperature operation of the probe, coil. Namely, thermal noise is reduced by cooling the detection coil of the probe, and the Q value is enhanced by cooling resistant substances of the electric wires. As a result of this, the sensitivity is enhanced.

It depends largely on the probe performance whether or not the high resolution and high S/N (: signal-to-noise) ratio requested in the high-sensitivity measurement can be accomplished. In particular, the detection coil of the probe becomes the most influential factor to hinder and disturb an exceedingly uniform magnetic field of about 0.1 ppb which is going to be generated in a sample space. This is because the detection coil exists in close vicinity to the sample.

As described above, manufacturing the detection coil with the superconducting material makes it possible to implement the high Q value. Meanwhile, manufacturing the detection coil with a normal conducting material allows implementation of the magnetization adjustment. In the latter case, however, it is impossible to accomplish a Q value which is almost comparable to the Q value implemented by the superconducting detection coil, even if the normal conducting detection coil is cooled down to the low temperature.

SUMMARY OF THE INVENTION

As having been explained so far, in the conventional technologies of the low-temperature probe having high sensitivity, the following problem exists: Namely, when the detection coil is manufactured with a normal conducting material, the limit exists to the Q value. Meanwhile, when the detection coil is manufactured with a superconducting material, the limit exists to the aspect of the magnetic-field uniformity degree. The existence of this problem requires that the probe or probe coil to be used for the high-sensitivity and high-resolution NMR apparatus satisfy the following conditions: Namely, the probe or probe coil does not disturb the magnetic-field uniformity, gives much less thermal noise, and exhibits the high resonant Q value. In the conventional technologies, however, it was difficult to satisfy these conditions.

It is an object of the present invention to provide a NMR probe for the nuclear magnetic resonance apparatus which allows implementation of the high-sensitivity NMR measurement by including a detection coil that causes only a minimum disturbance to the magnetic-field uniformity, and that acquires the high resonant Q value.

In order to accomplish the above-described object in the present invention, in a NMR probe for the nuclear magnetic resonance apparatus, there is provided a reception-dedicated probe circuit which is configured by electrically connecting a reception-dedicated coil and a compensation coil in series with each other, the reception-dedicated coil detecting a nuclear magnetic resonance signal emitted from a sample measured, the compensation coil being composed of a superconducting material, and compensating for inductance of the reception-dedicated coil.

Otherwise, in a NMR probe for the nuclear magnetic resonance apparatus, there are provided a reception-dedicated first tuning circuit and a transmission/reception-capable second tuning circuit, the first tuning circuit including a compensation coil, a first tuning-dedicated capacitor, and a first matching-dedicated capacitor, the first tuning circuit also resonating with a first frequency, the compensation coil being connected to a detection coil for detecting a nuclear magnetic resonance signal emitted from a sample measured, the second tuning circuit being connected to the detection coil, and including a second tuning-dedicated capacitor and a second matching-dedicated capacitor, the second tuning circuit also resonating with a second frequency.

According to the present invention, it becomes possible to implement the probe for the NMR apparatus which allows implementation of the high-resolution measurement despite its implementation of the higher-sensitivity performance.

Other objects, features and advantages of the invention will become apparent from the following description of the embodiments of the invention taken in conjunction with the accompanying drawings.

DESCRIPTION OF THE INVENTION

Figure 3:
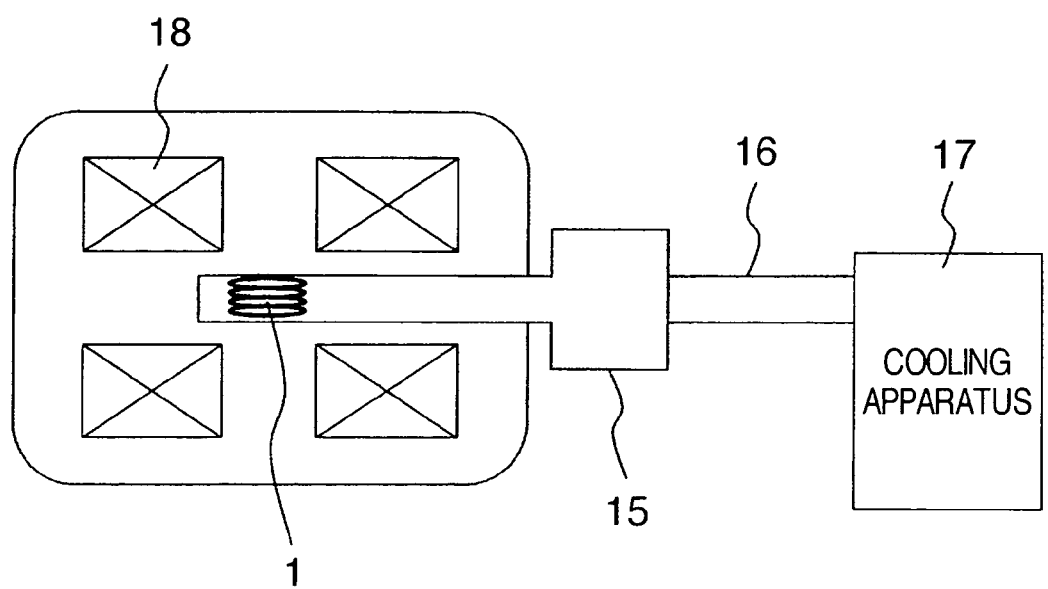
FIG. 3 is a schematic diagram of the NMR apparatus to which the present invention is applied.

FIG. 3 is a schematic diagram of the NMR apparatus to which the present invention is applied. In FIG. 3, the explanation will be given concerning a probe which is assumed to be horizontally inserted into a split-type magnet. The present invention, however, is not influenced by the shape of a NMR magnet 18 and the shape and insertion direction of the probe 15. This is because the present invention is a one relating to a detection circuit of the probe. Although the shape of the detection coil 1 may also be saddle type, solenoid type, or some other type, the solenoid type is advantageous for the purpose of acquiring the higher sensitivity. However, performing the detection of a NMR signal requires that direction of a magnetic field to be detected by the detection coil 1 be perpendicular to direction of the static magnetic field.

In FIG. 3, the superconducting magnet 18 generates a horizontal-direction uniform magnetic field on the periphery of the detection coil 1. The detection coil 1 is set up on the probe 15. In the low-temperature probe, the detection coil 1 is cooled down to an extremely low temperature by a refrigerant which had been produced by a cooling apparatus 17 and has passed through a transfer tube 16.

When the detection coil is manufactured with a superconducting material, the problem of critical current, which is characteristic of the superconductivity, will limit a current which can be made to flow. On account of this, in the conductor shape exhibiting a comparatively low critical-current value, such as thin-film shape exhibiting excellent superconducting characteristics, it is difficult to use the detection coil as a transmission coil. As a result, the detection coil manufactured with the super-conducting material is a reception-only-use coil. Accordingly, its configuration turns out to become the configuration of the probe coil based on the transmission/reception separation scheme.

Figure 4:
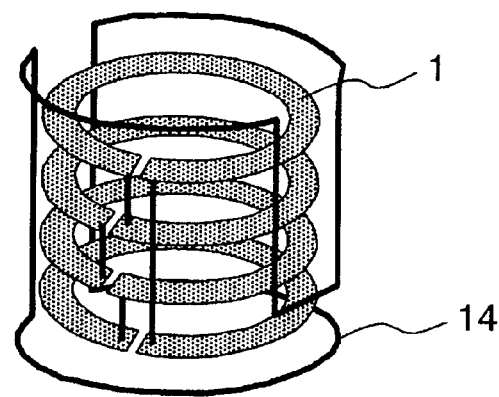
FIG. 4 is a configuration diagram of the coil indicating an example based on the transmission/reception separation scheme.

FIG. 4 illustrates an example of the configuration of the probe coil based on the transmission/reception separation scheme. This probe-coil configuration is that the detection coil (i.e., detection coil) 1 necessitating the sensitivity exists on the inner side, and that a transmission coil 14 exists on the outer side. Although, here, a combination is given where the detection coil 1 is the solenoid coil and the transmission coil 14 is the saddle coil, a combination of the same saddle coils is also preferable.

Incidentally, the probe coil in the present invention refers to a configuration of a coil group for performing a series of tasks of the transmission and detection, or a configuration of the coil group including a tuning circuit. Also, there are some cases where, when the probe coil refers to the configuration of the tuning circuit, the probe coil is called "a probe circuit" in particular.

Embodiment 1

Figure 1:
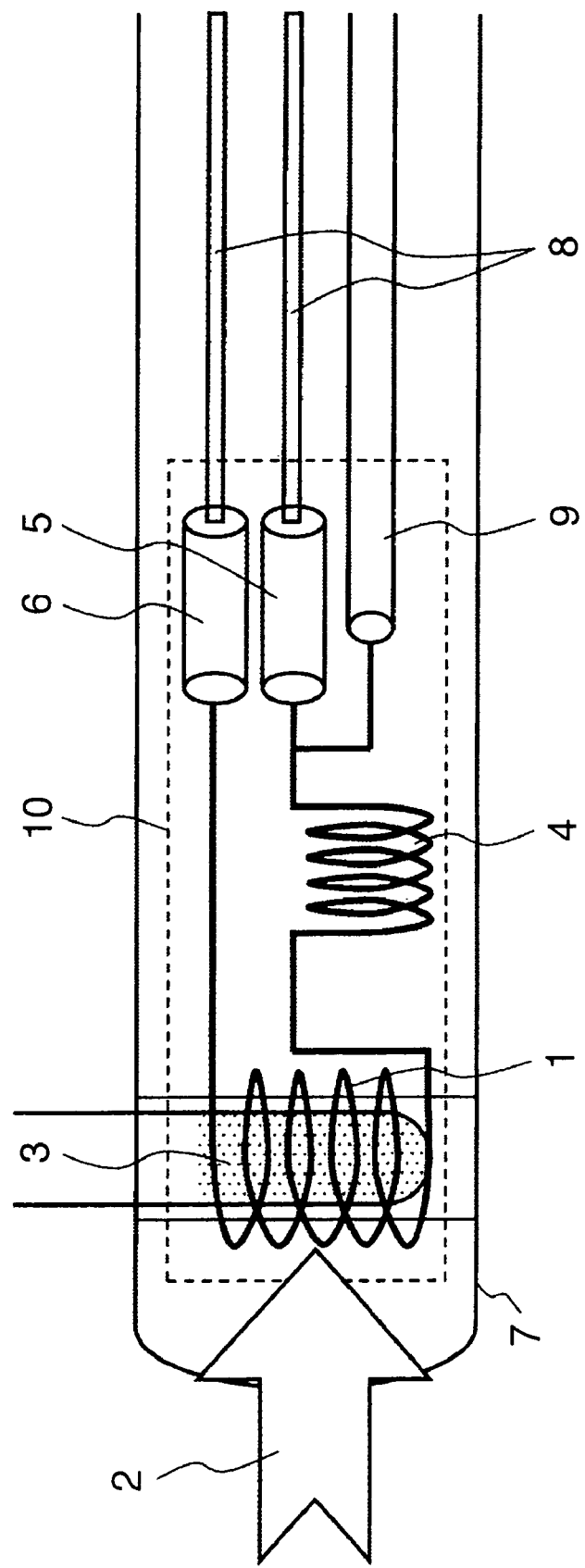
FIG. 1 is a configuration diagram of the low-temperature probe according to a first embodiment of the present invention.

FIG. 1 illustrates an embodiment of the transmission/reception-separation-type probe circuit according to the present invention. The low-temperature probe in the present embodiment is as follows: A sample 3, i.e., the measurement target, is set up inside the detection coil 1. A uniform static magnetic field 2 is generated in proximity to the detection coil 1 in the direction of the arrow. The direction of the magnetic field to be detected by the detection coil 1 is perpendicular to the direction 2 of the uniform static magnetic field.

In the low-temperature probe, in order to reduce the thermal noise down to a lowest possible limit, an inclusion 10 is cooled down to 20 K or lower. The basic structure of the low-temperature probe includes an outer container 7 for maintaining inside of the probe under vacuum for implementing the heat insulation, and a heat-insulation support structure for supporting the cooled-down inclusion 10.

The inclusion 10, which is an area cooled down to the extremely low temperature, includes the detection coil 1, a transmission coil (not illustrated), a reception-dedicated probe circuit (including 4, 5, and 6), and a transmission-dedicated probe circuit (not illustrated). The inclusion 10 also includes a coaxial cable 9 for transferring a radio-frequency wave signal, adjustment shafts 8 for mechanically adjusting the variable capacitors 5 and 6, i.e., the components of the reception-dedicated probe circuit, from the outside, and a RF shield (not illustrated) for shielding the detection coil 1 and the probe circuits from external electrical disturbances. Moreover, the inclusion 10 includes cooling components, such as a pipe (not illustrated) for transporting helium which becomes the refrigerant, and a heat exchanger (not illustrated) cooled down by the helium.

The reception-dedicated probe circuit includes the compensation coil 4 composed of a superconducting material, the tuning-dedicated variable capacitor 6 and the matching-dedicated variable capacitor 5. In addition, a cooled preamplifier (not illustrated) is set up which is used for amplifying the detected infinitesimal signal with a low noise. For problems such as space, the cooled preamplifier is set up at a portion positioned on the outer side of the magnet inside the probe 15.

Next, the explanation will be given below concerning electrical characteristics of the NMR probe and the probe circuits of the above-described configuration. The resonant frequency is determined by inductances of the coils and capacitances of the capacitors. Influences of parasitic impedances, such as inductances of wirings, capacitance between the wirings, capacitance between turns of the coils, are suppressed down within the adjustment range of the variable capacitors. Otherwise, the circuit constant is adjusted at the implementation stage.

Figure 2:
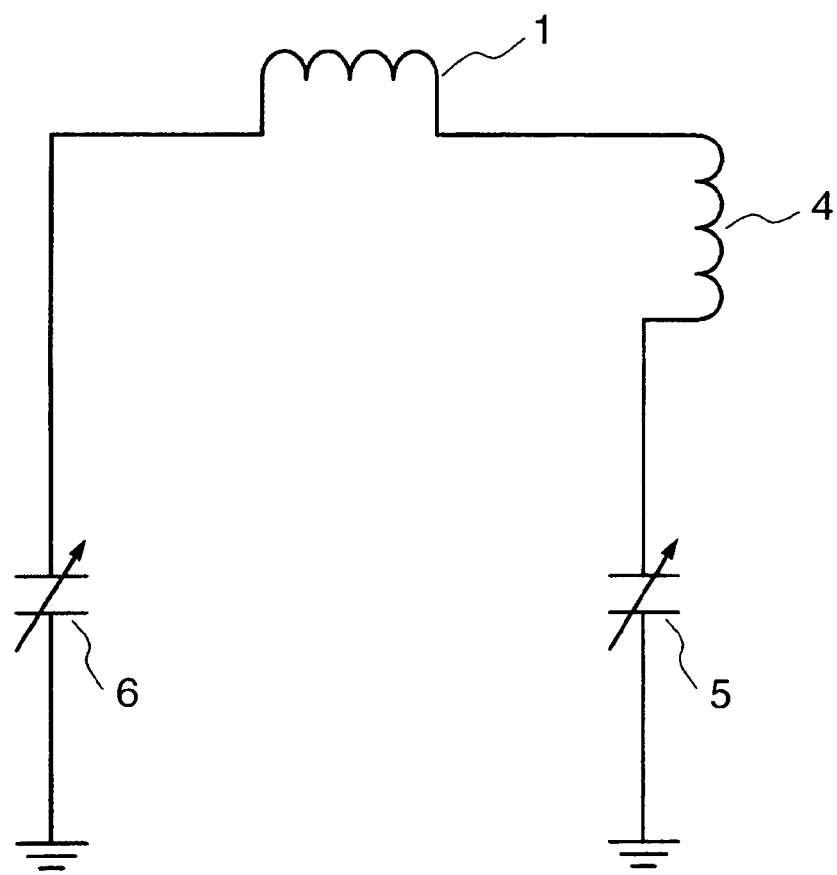
FIG. 2 is an equivalent-circuit diagram to the probe circuit relating to the first embodiment.

FIG. 2 illustrates an equivalent circuit to the probe circuit illustrated in FIG. 1. The influences of the parasitic impedances are suppressed down as described above. As a result, it becomes possible to discuss behavior of the probe circuit in proximity to the resonant frequency by using the equivalent circuit simplified in this way.

The equivalent circuit illustrated in FIG. 2 is configured by a series connection of the normal conducting detection coil 1, the superconducting compensation coil 4, the tuning-dedicated variable capacitor 6, and the matching-dedicated variable capacitor 5. The coaxial cable 9 is connected to both ends of the matching-dedicated variable capacitor 5 (as illustrated in FIG. 1), thereby detecting the signal. In the adjustment of the equivalent circuit, the component which makes a main contribution to adjustment of the resonant frequency is the tuning-dedicated variable capacitor 6, and the component which makes a main contribution to the impedance matching is the matching-dedicated variable capacitor 5.

The feature in the present embodiment lies in a point that the embodiment includes the compensation coil 4 which is electrically connected to the detection coil 1 in series therewith. The inductance of the compensation coil 4 is much larger than the inductance of the detection coil 1. The role of the compensation coil 4 lies in a point that the coil 4 explicitly compensates for the inductance of the detection coil 1, and increases the energy to be accumulated in the resonance circuit.

The Q value before the compensation coil 4 is inserted can be written as is represented by an Expression (1).

[Expression 1]

$$Q_0 = \frac{L}{r_s} \quad (1)$$

Here, L denotes the inductance of the detection coil 1, and $r_s$ denotes summation of resistance of the detection coil 1 and resistances of components such as the wirings. For example, by taking advantage of a small-loss (i.e., small-resistance) coil such as the superconducting coil, it becomes possible to enhance the effective Q value of the circuit as is represented by an Expression (2).

[Expression 2]

$$Q_1 = \frac{L + L_{sc}}{r_s} \quad (2)$$

Here, $L_{sc}$ denotes the inductance of the superconducting compensation coil. Otherwise, if the resistance is comparatively large like the normal conducting coil, the effective Q value is given by an Expression (3).

[Expression 3]

$$Q_2 = \frac{L + L_{nc}}{r_s + r_{nc}} \quad (3)$$

Here, $L_{nc}$ denotes inductance of the normal conducting compensation coil, and $r_{nc}$ denotes resistance of the normal conducting compensation coil. Accordingly, if the Q value ($=L_{nc}/r_{nc}$) of the compensation coil is higher than the Q value ($=L/r_s$) of the detection coil, $Q_2>Q_0$ holds, and thus the Q value of the circuit can be enhanced. Namely, it becomes possible to enhance the detection sensitivity of the probe. As is shown from the Expression (3), if the inductance $L_{nc}$ of the compensation coil is larger, the even larger effect can be acquired.

Unlike the detection coil 1, the compensation coil 4 is not required to detect the signal emitted from the sample 3. Accordingly, the compensation coil 4 is not restricted by such factors as the shape of the coil, shape of the conductor, material of the conductor, and distance of the coil from the sample. Consequently, if possible, a conductor is selected whose shape is comparatively unlikely to undergo influences from outside of the coil, and which results in smallness of the resistance (i.e., loss) of the coil. Also, it is desirable that the size of the entire detention circuit be smaller than a wavelength corresponding to the signal frequency dealt with. For example, as the shape of the coil, there exist toroidal shape and miannda shape. Also, as the material of the conductor, there exist the superconducting materials, the representatives of which are Y-based or Bi-based oxide superconductors, metal-based superconductors such as $MgB_2$ and NbTi, and compound-based superconductors such as $Nb_3Sn$. Otherwise, pure metals such as Cu, Al, Au, and Ag, or composite materials obtained by plating or pasting together these pure metals are conceivable as the material of the conductor. The compensation coil 4 is set at a position about 50 mm away from the sample space. This allows accomplishment of the compatibility between the electrical characteristics and the magnetic characteristics in the entire detention circuit including the detection coil 1.

As having been explained so far, the compensation coil 4 is connected to the detection coil 1 in series therewith. This makes it possible to enhance the Q value of the probe circuit. As a consequence, there exists an effect of enhancing the sensitivity of the NMR signal detected by the probe.

Embodiment 2

Figure 5:
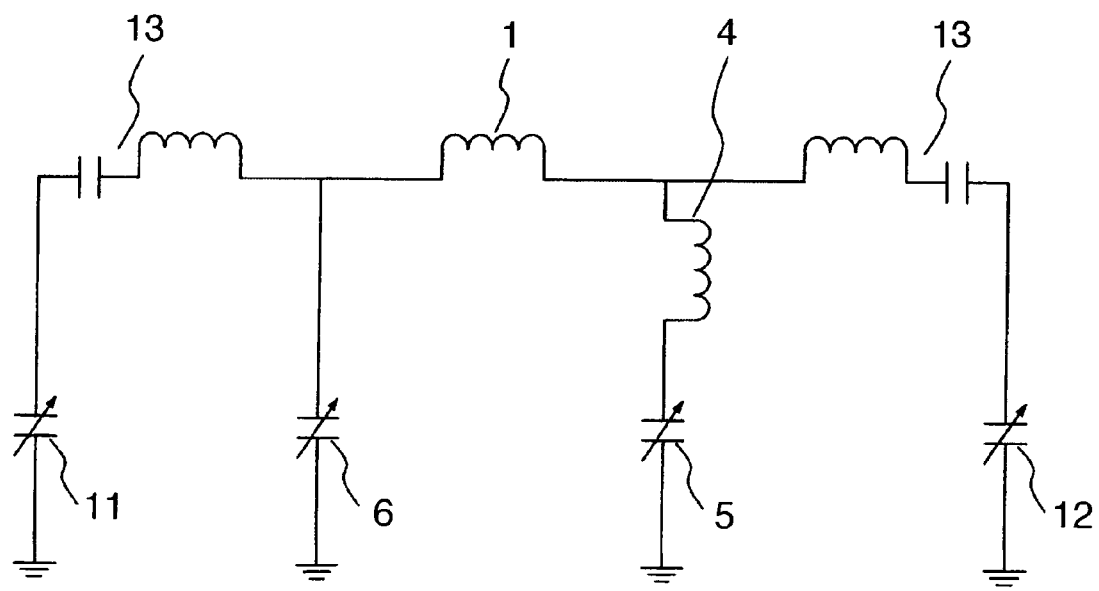
FIG. 5 is an equivalent-circuit diagram to the probe circuit relating to a second embodiment.
Figure 6:
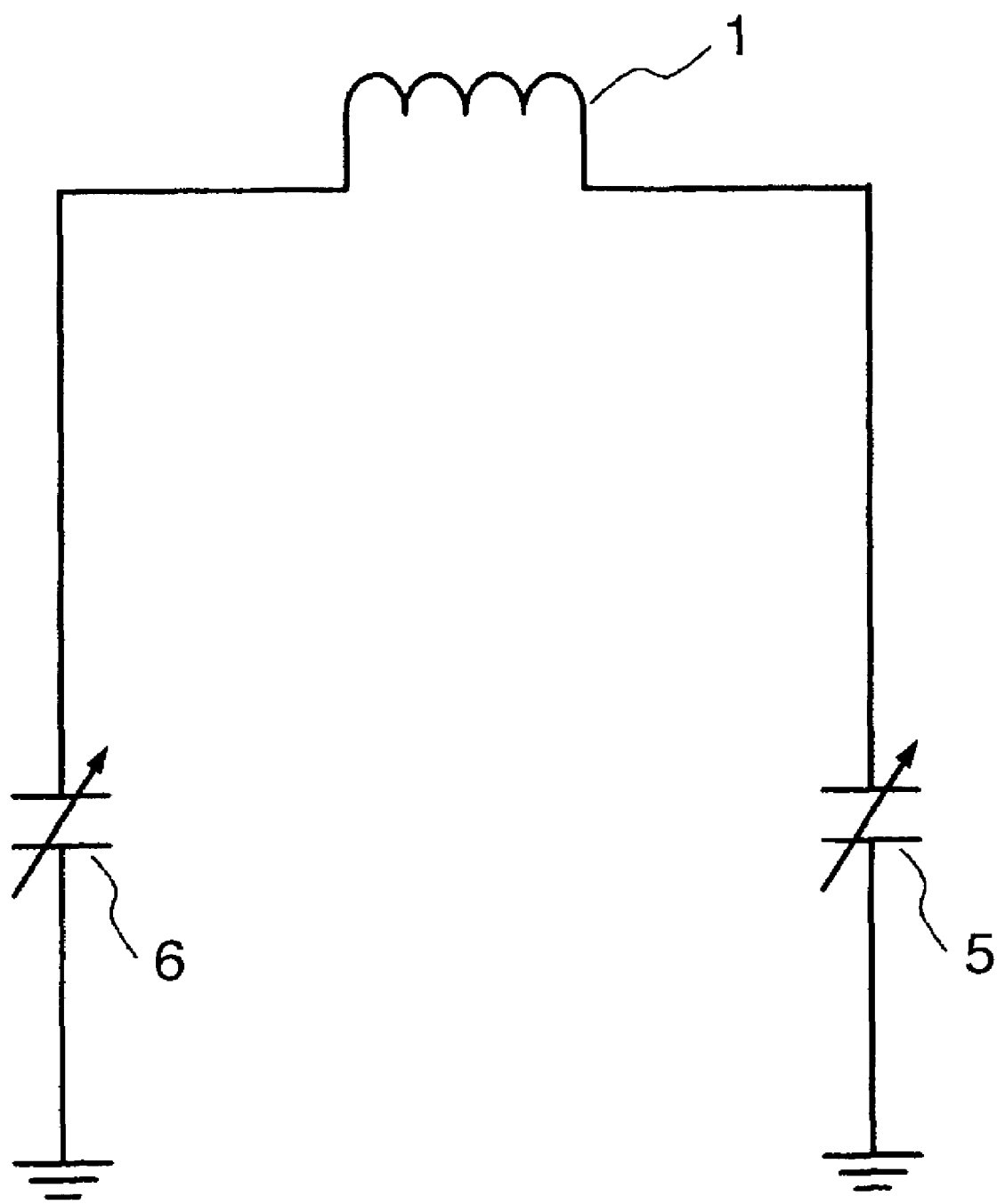
FIG. 6 is an equivalent-circuit diagram to the conventional probe circuit.

FIG. 5 illustrates an equivalent circuit to the probe circuit according to a second embodiment of the present invention. In the equivalent circuit illustrated in FIG. 5, another different detection circuit which resonates with a second frequency is connected to the detection circuit of the detection coil (detection coil) 1 illustrated in FIG. 2. The first frequency is the frequency of the nuclear species detected with the high sensitivity in the NMR measurement.

In FIG. 5, band pass filters (i.e., series resonance filters associated with the second frequency) 13 for implementing isolation between the first frequency and the second frequency are connected to both ends of the detection circuit which is illustrated in the equivalent circuit in FIG. 2 and which resonates with the first frequency. Moreover, a tuning-dedicated variable capacitor 11 associated with the second frequency and a matching-dedicated variable capacitor 12 associated with the second frequency are added to the band pass filters. This circuit configuration forms the equivalent circuit into a duplex tuning circuit where the detection coil 1 resonates with the first frequency and the second frequency.

If a superconducting material is used as the detection coil 1 in order to enhance the resonant Q value, it becomes substantially rather difficult to co-use the detection coil 1 as a transmission coil which deals with large electric power. This is because of the problem of current capacity which is determined by the critical current characteristic of the superconductivity.

However, in the circuit of the present embodiment which includes the compensation coil 4, the superconducting material need not be used as the detection coil 1 although the resonant Q value is high. Accordingly, it becomes possible to co-use the detection coil 1 as the transmission coil. If, however, the superconducting material is used as the compensation coil 4 in order to acquire the higher sensitivity, it is difficult to co-use the detection coil 1 with the use of only the first frequency.

In the resonant loop formed by the tuning circuit associated with the second frequency, the path including the compensation coil 4 comes to exhibit a high impedance, and thus the current scarcely flows therein. This means that the resonant loop is negligible. Consequently, when the superconducting material is used as the compensation coil 4 as well, it becomes possible to perform the transmission/reception at the different frequency without taking into consideration the problem of current capacity of the superconducting coil.

In the NMR measurement, it has become absolutely necessary to use a lock system for tracking a change in the central magnetic-field intensity due to magnetic-field drift or external disturbances, and controlling the nuclear magnetic resonance frequency. The lock system is also activated by observing the nuclear magnetic resonance signal of a specific atom. It is more advantageous that the nuclear species to be observed by the lock system differ from the nuclear species which is going to be mainly observed in the NMR measurement. For this purpose, deuterium ($^2H$ nucleus), i.e., an isotope of hydrogen, is commonly used. This situation requires that the transmission/reception of $^1$H nucleus and the transmission/reception of $^2$H nucleus be performed even in a minimum-essential configuration which the probe should implement. Consequently, it is preferable that the other frequency acquired by the method in the present embodiment be allocated to the lock channel.

As having been explained so far, in the practical detection-circuit configuration which performs the multiplex tuning, it also becomes possible to perform the high-sensitivity measurement by locating the compensation coil which is manufactured using such materials as a superconducting material.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A NMR probe for a nuclear magnetic resonance apparatus, comprising:
   a reception-dedicated probe circuit including a reception-dedicated coil having a first Q value and a compensation coil having a second Q value electrically connected in series with each other, the second Q value being a higher value than the first Q value;
   said reception-dedicated coil detecting a nuclear magnetic resonance signal emitted from a sample measured,
   said compensation coil being composed of a superconducting material compensating for inductance of said reception-dedicated coil so that during operation of the NMR probe said reception-dedicated probe circuit including said reception-dedicated coil and said compensation coil connected in series has an effective Q value which is higher than the first Q value.

2. The NMR probe according to claim 1, wherein an inductance of said compensation coil is larger than said inductance of said reception-dedicated coil, and a resistance associated with said compensation coil is arranged so that the second Q value is higher than the first Q value.

3. The NMR probe according to claim 1, wherein said reception-dedicated probe circuit further includes a variable capacitor connected in series with said reception-dedicated coil.

4. The NMR probe according to claim 1, wherein said reception-dedicated probe circuit further includes at least one variable capacitor connected in series with said series connected reception-dedicated coil and compensation coil.

5. The NMR probe according to claim 1, wherein said reception-dedicated probe circuit further includes at least a first variable capacitor connected in series with said reception-dedicated coil and a second variable capacitor connected in series with said compensation coil.

6. The NMR probe according to claim 1, comprising cooling components arranged to maintain an operation temperature of said compensation coil to be lower than a superconducting transition temperature of said superconducting material incorporated in said compensation coil.

7. A NMR probe for a nuclear magnetic resonance apparatus, comprising:
   a reception-dedicated probe circuit including:
   a detection coil;
   a compensation coil electrically connected in series with the detection coil; and
   at least one variable capacitor connected in series with the series connection of the compensation coil and the detection coil;
   wherein said detection coil is arranged for detecting a nuclear magnetic resonance signal emitted from a sample measured, and
   wherein the compensation coil is arranged to have an inductance which is larger than an inductance of the detection coil, and a resistance associated with the compensation coil which is not greater than a resistance of the detection coil.

8. The NMR probe for a nuclear magnetic resonance apparatus of claim 7, wherein the at least one variable capacitor includes a first variable capacitor connected in series with the detection coil and a second variable capacitor connected in series with the compensation coil.

9. The NMR probe for a nuclear magnetic resonance apparatus of claim 7, wherein the compensation coil incorporates a superconductive material.

10. The NMR probe for a nuclear magnetic resonance apparatus of claim 9, further comprising cooling components arranged to maintain an operation temperature of the compensation coil to be lower than a superconducting transition temperature of the superconducting material incorporated in the compensation coil.

* * * * *